United States Patent
Lindoff et al.

(10) Patent No.: US 6,934,346 B2
(45) Date of Patent: Aug. 23, 2005

(54) APPARATUS AND METHOD FOR SUBSTANTIALLY ELIMINATING A NEAR-CHANNEL INTERFERING AMPLITUDE MODULATED SIGNAL

(75) Inventors: Bengt Lindoff, Lund (SE); William O. Camp, Jr., Chapel Hill, NC (US)

(73) Assignee: Telefonaktiebolaget L M Ericsson (Publ), Stockholm (SE)

(*) Notice: Subject to any disclaimer, the term of this patent is extended or adjusted under 35 U.S.C. 154(b) by 0 days.

(21) Appl. No.: 10/874,014

(22) Filed: Jun. 21, 2004

(65) Prior Publication Data
US 2004/0234011 A1 Nov. 25, 2004

Related U.S. Application Data (63) Continuation of application No. 09/398,668, filed on Sep. 17, 1999.

(51) Int. Cl.$^7$ ............................................. H04B 1/10
(52) U.S. Cl. ...................................... 375/349; 375/350
(58) Field of Search ............................... 375/147, 148, 375/231, 232, 322, 324, 340, 346, 349, 350

(56) References Cited

U.S. PATENT DOCUMENTS

| | | | |
|---|---|---|---|
| 5,199,047 A | | 3/1993 | Koch |
| 5,222,078 A | | 6/1993 | Cason et al. |
| 5,251,233 A | | 10/1993 | Labedz et al. |
| 5,371,902 A | | 12/1994 | Marz |
| 5,422,889 A | | 6/1995 | Sevenhans et al. |
| 5,479,450 A | * | 12/1995 | Okanoue et al. ............ 375/340 |
| 5,579,347 A | | 11/1996 | Lindquist et al. |
| 5,604,929 A | | 2/1997 | Loper et al. |
| 5,749,051 A | | 5/1998 | Dent |
| 5,787,118 A | | 7/1998 | Ueda |
| 6,026,130 A | | 2/2000 | Rahmatullah et al. |
| 6,263,030 B1 | | 7/2001 | Khayrallah |
| 6,373,888 B1 | | 4/2002 | Lindoff |
| 6,449,320 B1 | | 9/2002 | Lindoff |
| 6,487,259 B1 | | 11/2002 | Russo |

FOREIGN PATENT DOCUMENTS

| | | |
|---|---|---|
| EP | 0 453 213 | 10/1991 |
| EP | 0 604 208 | 6/1994 |
| EP | 0 806 841 | 11/1997 |
| GB | 2 287 620 | 9/1995 |
| WO | WO 98/04050 | 1/1998 |

OTHER PUBLICATIONS

John G. Proakis, Digital Communications; 5 pages.
Lawrence E. Larson; RF and Microwave Circuit Design for Wireless Communications; 6 pages.

* cited by examiner

*Primary Examiner*—Khai Tran
*Assistant Examiner*—David B. Lugo
(74) *Attorney, Agent, or Firm*—Jenkens & Gilchrist, P.C.

(57) ABSTRACT

An apparatus and method are provided that compensates for the problematic time-varying DC offset by effectively eliminating a near-channel amplted modulated interferer from a signal. The apparatus includes a first channel estimator for estimating a plurality of first channel filter taps $\hat{H}$ using a first signal model $S_t$, and a second channel estimator for estimating a plurality of second channel filter taps $\tilde{H}$ using a second signal model $\tilde{S}_t$. The apparatus also includes a processor for selecting which of the first signal model $S_t$ and the second signal model $\tilde{S}_t$ is to be used or was used to substantially eliminate the near-channel amplitude modulated interferer from the received signal. The apparatus can be a mobile phone, base station, direct conversion receiver, or communications system (for example).

34 Claims, 7 Drawing Sheets

APPARATUS AND METHOD FOR SUBSTANTIALLY ELIMINATING A NEAR-CHANNEL INTERFERING AMPLITUDE MODULATED SIGNAL

CROSS-REFERENCE TO RELATED APPLICATIONS

This application is a continuation of prior U.S. patent application Ser. No. 09/398,668, filed Sep. 17, 1999, incorporated herein by reference.

BACKGROUND OF THE INVENTION

1. Technical Field of the Invention

The present invention generally relates to the telecommunications field and, in particular, to an apparatus and method that compensates for a problematic time-varying DC offset by effectively eliminating a near-channel interfering amplitude modulated (AM) signal from a communications channel.

2. Description of Related Art

In the telecommunications field, one of the most significant design challenges involves the development of new direct conversion receivers that are capable of improving the demodulated quality of a signal. Traditional direct conversion receivers or homodyne receivers generally operate to demodulate an incoming signal by directly converting the incoming signal down to baseband, without the use of any intermediate frequencies, and outputting a desired signal. An example of the traditional direct conversion receiver is briefly discussed below with respect to FIG. 1.

Figure 1:
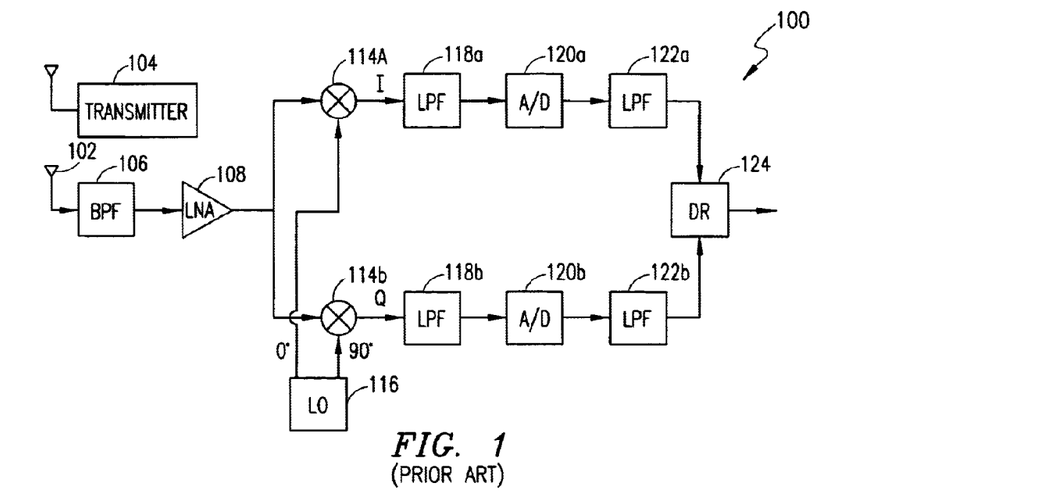
FIG. 1 (PRIOR ART) is a block diagram illustrating the basic components of a traditional direct conversion receiver.

Referring to FIG. 1 (PRIOR ART), there is illustrated a block diagram of a traditional direct conversion receiver 100. Basically, the traditional direct conversion receiver 100 includes an antenna 102 for receiving a signal from a transmitter 104. The received signal is filtered by a band pass filter (BPF) 106 designed to pass a desired frequency band such as the GSM (Global System for Mobile Communications) frequency band from the received signal. The filtered signal is amplified in a low noise amplifier (LNA) 108 and down-converted to a base band Inphase (I) component and a base band Quadrature (Q) component using mixers 114a and 114b, respectively, and a local oscillator (LO) 116. The local oscillator 116 outputs a frequency adapted to a carrier frequency of the received signal. The base band I and Q components are respectively filtered by first low pass filters (LPFs) 118a and 118b, converted to digital signals by analog-to-digital convertors (A/Ds) 120a and 120b, and then filtered by second low pass filters (LPFs) 122a and 122b to obtain a signal format that can be handled by a data recovery unit (DR) 124. The data recovery unit 124 operates to demodulate the received signal.

Traditional direct conversion receivers 100 have an efficient radio receiver architecture in terms of cost, size and current consumption. However, traditional direct conversion receivers 100 suffer from the well known DC offset problem that can be attributable to three different sources: (1) transistor mismatch in a signal path; (2) the local oscillator 116 outputting a signal that leaks and self-down converts to DC when passed through mixers 114a and 114b; and (3) a large near-channel amplitude modulated (AM) interfering signal leaking into the local oscillator 116 and self-downconverting to DC. Since, the resulting DC offset can be several decibels (dB) larger than the information signal, one should take care of the DC offset to be able to recover the transmitted data in the data recovery unit 124.

The DC offsets due to (1) and (2) can be assumed to be constant during one burst (i.e., a number of received symbols) and can be taken care of by adding an extra DC component to the signal model used while demodulating the transmitted data in the data recovery unit 124. This method is well known in the art. However, the DC offset due to (3) is time-varying because of the amplitude variations in the interfering signal and as such it is difficult to compensate for this particular DC offset. Two examples of how the traditional direct conversion receiver 100 can be adapted to compensate for such AM interfering signals are disclosed in WO 98/04050 and EP 0 806 841, and briefly described below with respect to FIG. 2.

Figure 2:
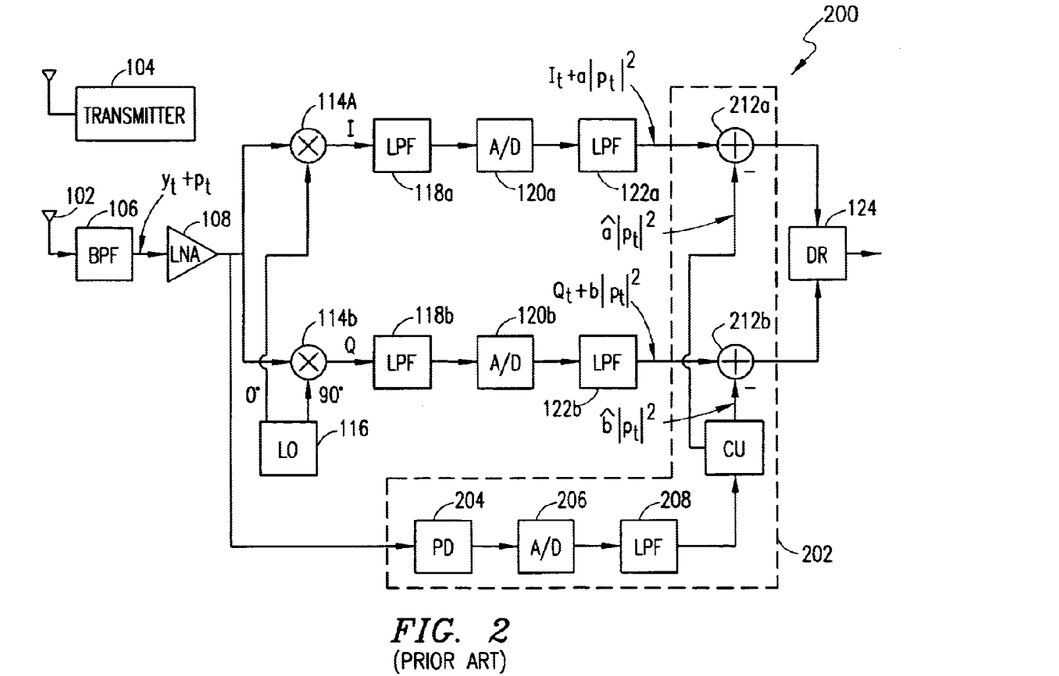
FIG. 2 (PRIOR ART) is a block diagram illustrating a traditional direct conversion receiver adapted to include a third receiver for DC offset compensation.

Referring to FIG. 2 (PRIOR ART), there is illustrated a block diagram of a traditional direct conversion receiver 200 configured to compensate for AM interfering signals as described in WO 98/04050 and EP 0 806 841. The general idea disclosed in both of these documents is to add a third receiver 202 (in addition to the I and Q receivers described above) designed to compensate for the dominating AM interfering signal.

The traditional direct conversion receiver 200 excluding the third receiver 202 generally operates as the direct conversion receiver 100 described above wherein like numerals represent like parts throughout FIGS. 1 and 2. For purposes of the discussion related to the direct conversion receiver 200 of FIG. 2, the received signal can include a wanted signal $y_t$ and an unwanted near-channel interferer $p_t$. Due to nonlinear effects in the low noise amplifier 108 and the mixer 114a it can be shown that the dominated output from the second low-pass filter 122a is a wanted I component $I_t$ and a fraction of the squared envelope of the interfering signal $a|p_t|^2$. Likewise, the dominated output from the second low-pass filter 122b is a wanted Q component $Q_t$ and a fraction of the squared envelope of the interfering signal $b|p_t|^2$.

The third receiver 202 is designed to take into account the nonlinear effects within the low noise amplifier 108 and the mixers 114a and 114b which collectively operate to convert the interfering signal to a base band signal. The low noise amplifier 108 directs the received signal to a power detector (PD) 204 which functions to detect an envelope of the received signal. It should be noted that this detected envelope consists mainly of the envelope attributable to the near-channel AM interfering signal whenever the unwanted interferer $p_t$ is much larger than the wanted signal $y_t$. The power detected signal is then converted into the digital domain by an analog-to-digital convertor (A/D) 206, filtered by a low pass filter (LPF) 208 and fed to a control unit (CU) 210 which multiplies the detected envelopes with estimated parameters $\hat{a}$ and $\hat{b}$. The estimated interfering signals $\hat{a}|p_t|^2$ and $\hat{b}|p_t|^2$ of the distortion are respectively input to subtractors 212a and 212b and subtracted from the I and Q components to obtain "relatively clean" I and Q components. The "relatively clean" I and Q components are then input to the data recovery unit 124.

Even if the solution to the DC offset problem described in WO 98/04050 and EP 0 806 841 appears to be promising it still has disadvantages, in terms of cost and current, due to the need to implement a third receiver. Therefore, there is a need for an apparatus and method that can suppress the near-channel AM interferer in a cost and current efficient manner.

BRIEF DESCRIPTION OF THE INVENTION

The present invention is an apparatus and method that compensates for the problematic time-varying DC offset by substantially eliminating a near-channel amplitude modulated interferer from a signal. The apparatus includes a first channel estimator for estimating a plurality of first channel filter taps $\hat{H}$ using a first signal model $S_t$, and a second channel estimator for estimating a plurality of second channel filter taps $\hat{H}$ using a second signal model $\tilde{S}_t$. The apparatus also includes a processor for selecting which of the first signal model $S_t$ and the second signal model $\tilde{S}_t$ is to be used or was used to substantially eliminate the near-channel amplitude modulated interferer from the received signal. The apparatus and method can be implemented in, for example, a mobile phone, base station, direct conversion receiver, or communications system.

BRIEF DESCRIPTION OF THE DRAWINGS

A more complete understanding of the method and apparatus of the present invention may be had by reference to the following detailed description when taken in conjunction with the accompanying drawings wherein.

DETAILED DESCRIPTION OF THE DRAWINGS

Referring to FIGS. 3–8, there are disclosed exemplary embodiments of an apparatus 300 and preferred method 800 each of which is capable of effectively eliminating near-channel amplitude modulated (AM) interfering signals from signals in accordance with the present invention.

Although the apparatus 300 is described with respect to a direct conversion receiver (e.g., homodyne receiver) used in a digital communications system, it should be understood that the present invention can be used within any communications device, but is especially suited for use with a mobile phone and base station. Accordingly, the different embodiments of the apparatus 300 and preferred method 800 should not be construed in a limited manner.

Figure 3:
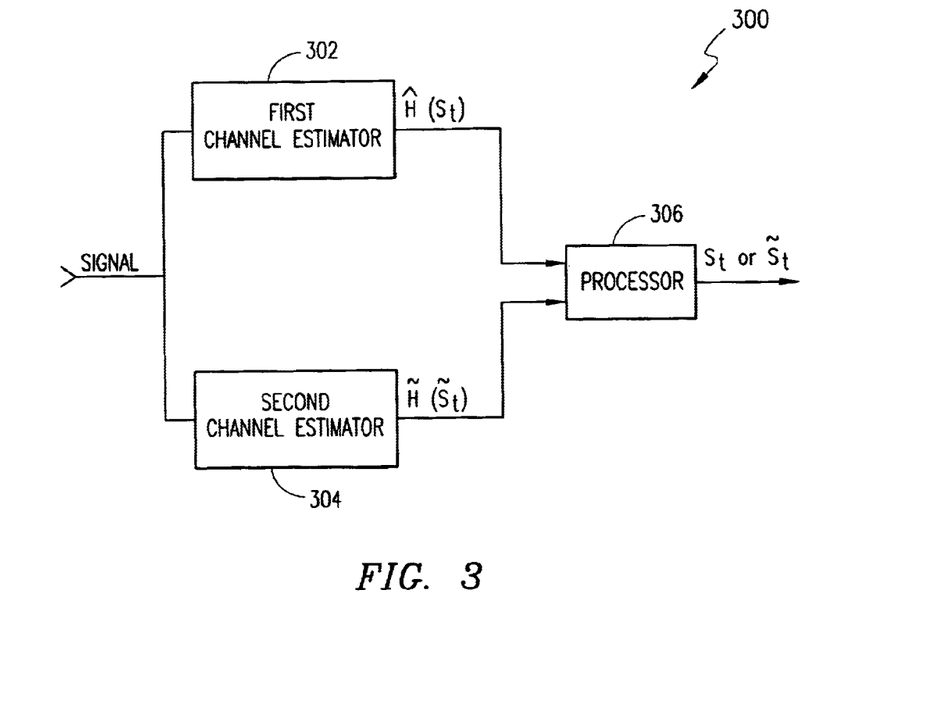
FIG. 3 is a block diagram illustrating the basic components associated with an exemplary apparatus of the present invention.

Referring to FIG. 3, there is a block diagram illustrating the basic components associated with the exemplary apparatus 300 of the present invention. Basically, the apparatus 300 (described as a direct conversion receiver) enables the suppression of AM interfering signals using only the I and Q baseband signals in a predetermined manner such that no extra receiver (see the third receiver 202 of FIG. 2) is needed, implying a cost and current efficient receiver having low complexity and high performance.

More specifically, the direct conversion receiver 300 of the present invention includes a first channel estimator 302 operable to estimate a plurality of first channel filter taps $\hat{H}$ using a first signal model $S_t$, and a second channel estimator 304 operable to estimate a plurality of second channel filter taps $\hat{H}$ using a second signal model $\tilde{S}_t$. The direct conversion receiver 300 also includes a processor 306 operable to select either the first signal model $S_t$ or the second signal model $\tilde{S}_t$ that is to be used or was used to substantially eliminate the near-channel AM interfering signal from the received signal. A detailed description of how each embodiment of the direct conversion receiver 300 operates to substantially eliminate the AM interfering signal is provided below with respect to FIGS. 4–7.

Figure 4:
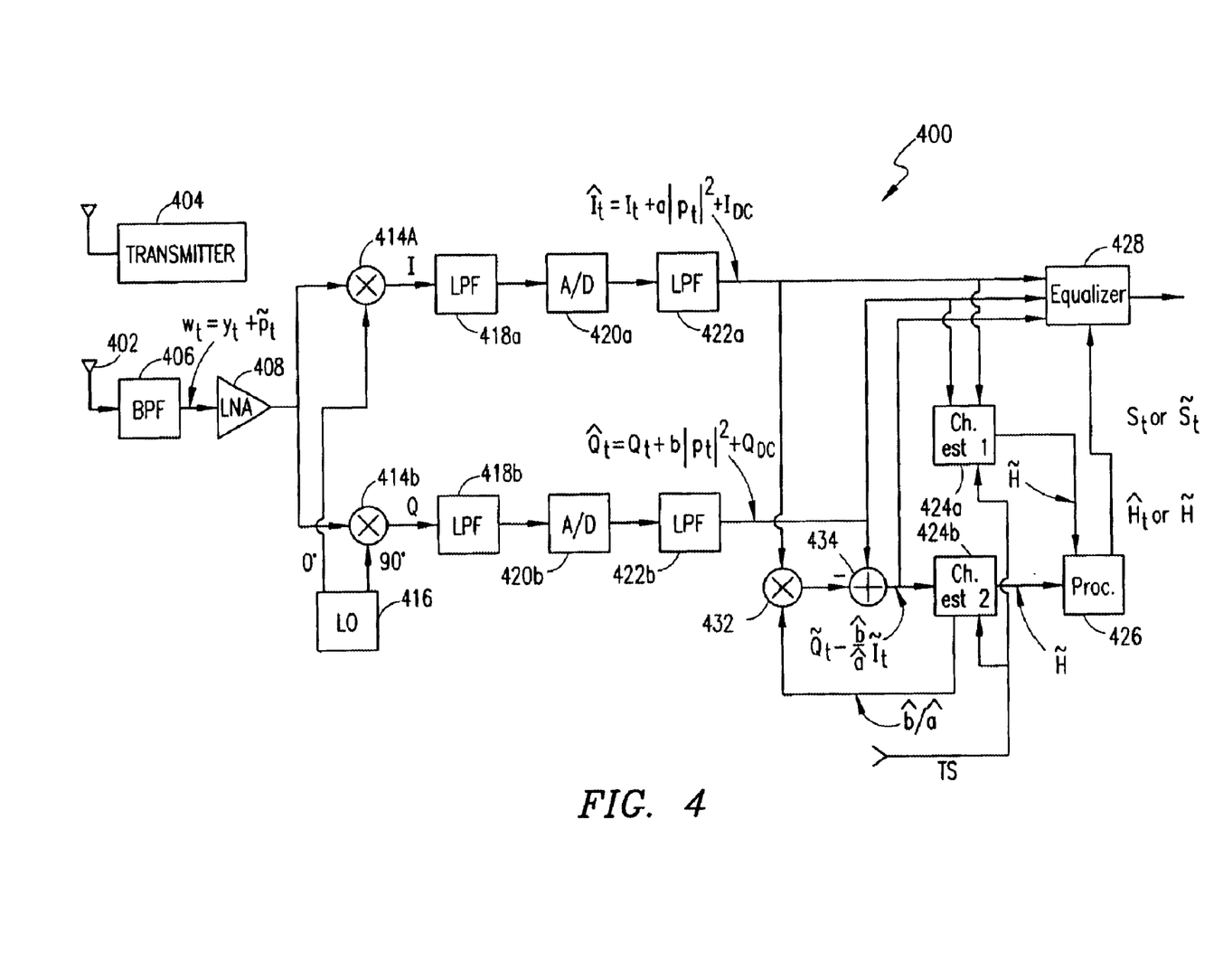
FIG. 4 is a block diagram illustrating in greater detail a first embodiment of the exemplary apparatus shown in FIG. 3.

Referring to FIG. 4, there is a block diagram illustrating in greater detail a first embodiment of an exemplary direct conversion receiver 400 in accordance with the present invention. Certain details associated with direct conversion receivers are known in the industry and as such need not be described herein. Therefore, for clarity, the descriptions provided below in relation to the direct conversion receivers of the present invention omit some elements known to those skilled in the art that are not necessary to understand the invention.

The direct conversion receiver 400 includes an antenna 402 for receiving a signal from a transmitter 404. The received signal is filtered by a band pass filter (BPF) 406 designed to pass a desired frequency band such as the GSM (Global System for Mobile Communications) frequency band from the received signal. The received signal output from the band pass filter 406 can be represented as:

$$w_t = y_t + \tilde{p}_t \quad (1)$$

$$= r_t \cos(\omega_0 t + \varphi_t) + p_t \cos(\omega_1 t + \theta_t) \quad (2)$$

where $w_t$ is the received signal, $y_t$ is the desired signal at carrier frequency $\omega_0$, $\tilde{p}_t$ is the near-channel AM interfering signal at carrier frequency $\omega_1$, and $\omega_0$ and $\omega_1$ are within the pass band of the band pass filter 406.

The filtered signal is amplified in a low noise amplifier (LNA) 408 and down-converted to a base band Inphase (I) component and a base band Quadrature (Q) component using mixers 414a and 414b, respectively, and a local oscillator (LO) 416. The local oscillator 416 outputs two oscillation signals $LO_I$ and $LO_Q$ adapted to a carrier frequency of the received signal, the two oscillation signals can be represented as follows:

$$LO_I(t) = \cos(\omega_0 t) \quad (3)$$

$$LO_Q(t) = \sin(\omega_0 t) \quad (4)$$

where $LO_I$ and $LO_Q$ are the oscillating signals associated with the I and Q components, respectively. The oscillating signals $LO_I$ and $LO_Q$ and the received signal are multiplied in the mixers 414a and 414b.

Due to the nonlinearities of the local oscillator 416 and interferer leakage (represented with the scale factors $\alpha'$, $\beta'$), the low pass filtered signal output from the I component mixer 414a and a first low pass filter (LPF) 418a can be represented as follows:

$$\tilde{I}_t = LPF\{(r_t\cos(\omega_0 t + \varphi_t) + p_t\cos(\omega_1 t + \theta_t) + \alpha'_I\cos(\omega_0 t + \gamma))* \quad (5)$$
$$(\cos(\omega_0 t) + \beta'_I p_t\cos(\omega_1 t + \theta_t + \delta))\}$$

$$= r_t \cos\varphi_t + \beta_I p_t^2 + \alpha_I \quad (6)$$

Likewise, the low pass filtered signal output from the Q component mixer 414*b* and a first low-pass filter (LPF) 418*b* can be represented as follows:

$$\tilde{Q}_t = r_t \sin\phi_t + \beta_Q p_t^2 + \alpha_Q \quad (7)$$

Thereafter, the $\tilde{I}$ and $\tilde{Q}$ components are respectively converted into digital domain by analog-to-digital convertors (A/Ds) 420*a* and 420*b* and respectively filtered by second low pass filters (LPFs) 422*a* and 422*b*. And, after certain normalizations the base band components can be represented as:

$$\tilde{I}_t = I_t + a|p_t|^2 + I_{DC} \quad (8)$$

$$\tilde{Q}_t = Q_t + b|p_t|^2 + Q_{DC} \quad (9)$$

where $I_t$, $Q_t$ are the wanted I and Q components, and $I_{DC}$, $Q_{DC}$ are the DC components on the I and Q components, respectively. $|p_t|^2$ is the low pass filtered and sampled squared envelope of the interfering AM signal. In case of digital transmission over radio channels with intersymbol interference, such as for instance in GSM or a D-AMPS cellular systems, the wanted I and Q components can be written in a complex notation as follows:

$$I_t + jQ_t = H^T U_t + e_t \quad (10)$$

where $H = [h_0, \ldots, h_L]^T$ is a vector of complex valued channel filter taps, $U_t = [u_t, \ldots, u_{t-L}]^T$ is a vector of complex transmitted symbols, and $e_t$ is some kind of complex valued noise. Therefore, the complex valued base band signal for a first signal model $S_t$ can be represented as:

$$S_t = \tilde{I}_t + j\tilde{Q}_t \quad (11)$$

$$= H^T U_t + (a+jb)|p_t|^2 + DC + e_t \quad (12)$$

$$= \sum_{k=o}^{L}\{h_k^I + jh_u^Q\}\{U_t^I + jU_t^Q\} + e_t^I + je_t^Q \quad (13)$$

where $j = \sqrt{-1}$.

The $\tilde{I}_t$ and $\tilde{Q}_t$ components are input to a first channel estimator 424*a* that correlates, using the first signal model $S_t$, a known training sequence (TS) with the received signal $S_t$ (which contains the same known training sequence) to determine a synchronization position and an estimate of the first set of channel filter taps $\hat{H}$. The use of the first signal model $S_t$ in estimating the channel filter taps $\hat{H}$ is well known in the art. In fact, the first signal model $S_t$ was the only signal model used to estimate channel filter taps $\hat{H}$ in traditional direct conversion receivers. The estimated channel filter taps $\hat{H}$ are input to a processor 426 that is described in detail below.

Generally, the present invention includes a second channel estimator 424*b* that uses a second signal model $\tilde{S}_t$ to estimate a second set of channel filter taps $\tilde{H}$ that are input to the processor 426 which selects the signal model $S_t$ or $\tilde{S}_t$ that is to be used to further process the received signal. In other words, the processor 426 selects the appropriate signal model $S_t$ or $\tilde{S}_t$ using the estimated channel filter taps $\hat{H}$ and $\tilde{H}$ and some other parameters (e.g., residuals) discussed below. Thereafter, an equalizer 428, coupled to the processor 426, uses either the first or second set of channel filter taps $\hat{H}$ or $\tilde{H}$ corresponding to the selected signal model $S_t$ or $\tilde{S}_t$ to equalize the received signal. It should be noted that the equalizer 428 also receives It from the second low pass filter 422*a*, $\tilde{Q}_t$ from the second low pass filter 422*b*, and $$\tilde{Q}_t - \frac{\hat{b}}{\hat{a}}\tilde{I}_t$$

from a subtractor 434 before equalizing the received signal.

More specifically, the second signal model $\tilde{S}_t$, represented as the component $$\tilde{Q}_t - \frac{\hat{b}}{\hat{a}}\tilde{I}_t$$

where $\hat{a}$ and $\hat{b}$ are respective estimates of a and b from equations 8 and 9, is input to the second channel estimator 424*b*. The second channel estimator 424*b* operates to correlate the known training sequence (TS) with the $$\tilde{Q}_t - \frac{\hat{b}}{\hat{a}}\tilde{I}_t$$

component to determine a synchronization position and an estimate of the second set of channel filter taps $\tilde{H}$. The $$\frac{\hat{b}}{\hat{a}}\tilde{I}_t$$

portion of the second signal model $\tilde{S}_t$ is generated using a multiplicator 432 which receives $\tilde{I}_t$ from the second low pass filter 422*a*, and receives the estimated parameters $\hat{a}$ and $\hat{b}$ from the processor 426. The multiplicator 432 outputs $$\frac{\hat{b}}{\hat{a}}\tilde{I}_t$$

to the subtractor 434 which receives $\tilde{Q}_t$ from the second low pass filter 422*b* and outputs the component $$\tilde{Q}_t - \frac{\hat{b}}{\hat{a}}\tilde{I}_t.$$

The second signal model $\tilde{S}_t$ can be represented as follows:

$$\tilde{S}_t(\hat{b}/\hat{a}) = \tilde{Q}_t - \frac{\hat{b}}{\hat{a}}\tilde{I}_t \quad (14)$$

$$= \tilde{H}^T \tilde{U}_t + \text{imag}(e_t) - \frac{\hat{b}}{\hat{a}}\text{real}(e_t) + R_{DC} \quad (15)$$

where $\tilde{U}_t = [\text{real}(U_t)\ \text{imag}(U_t)]$ does not contain any distortion $|p_t|^2$, implying the elimination of the AM interferer.

The derivation to obtain equation (15) from equation (14) follows:

$$\tilde{S}_t\left(\frac{\hat{b}}{\hat{a}}\right) = \tilde{Q}_t - \frac{\hat{b}}{\hat{a}}\tilde{I}_t \quad (16)$$

$$= Q_t - \frac{\hat{b}}{\hat{a}}I_t + \left[b - \frac{\hat{b}a}{\hat{a}}\right]|p_t|^2 + \left\{Q_{DC} - \frac{\hat{b}}{\hat{a}}I_{DC}\right\}$$

where $$Q_{DC} - \frac{\hat{b}}{\hat{a}} I_{DC} = R_{DC}$$

(see equation 15), and assuming $\hat{a}=a$ and $\hat{b}=b$ then $|p_t|^2$ vanishes.

Equation 10 can be written as:

$$I_t + jQ_t = \sum_k \{h_k^I u_{t-k}^I - h_k^Q u_{t-k}^Q\} + j\{h_k^I u_{t-k}^Q + h_k^Q u_{t-k}^I\} + e_t^I + je_t^Q \quad (17)$$

where $e_t$ is expressed in real and imaginary parts as $e_t = e_t^I + je_t^Q$, $h^I$ and $h^Q$ respectively represent the real and imaginary parts of the channel filter taps h, and $u^I$ and $u^Q$ respectively represent the real and imaginary parts of the transmitted symbols $u_t$.

Rearranging equation 17 yields $$I_t + jQ_t = e_t^I + \left\{ \sum_k h_k^I u_{t-k}^I - h_k^Q u_{t-k}^Q \right\} + \quad (18)$$

$$j\left( \left\{ \sum_k h_k^I u_{t-k}^Q + h_k^Q u_{t-k}^I \right\} + e_t^Q \right)$$

where $e_t^I + \left\{ \sum_k h_k^I u_{t-k}^I - h_k^Q u_{t-k}^Q \right\} = I_t$ and $\left( \left\{ \sum_k h_k^I u_{t-k}^Q + h_k^Q u_{t-k}^I \right\} + e_t^Q \right) = \tilde{Q}_t$ Then, substituting for $I_t$ and $Q_t$ in equation 16, and assuming $\hat{a}=a$ and $\hat{b}=b$, $$\tilde{S}_t\left(\frac{\hat{b}}{\hat{a}}\right) = \sum_k \left(h_k^Q - \frac{\hat{b}}{\hat{a}} h_k^I\right) u_{t-k}^I + \sum_k \left(h_k^I - \frac{\hat{b}}{\hat{a}} h_k^Q\right) u_{t-k}^Q + \quad (19)$$

$$\text{imag}\{e_t\} - \frac{\hat{b}}{\hat{a}} \text{re}\{e_t\} + R_{DC}$$

where $\text{imag}\{e_t\} = e_t^I$ and $\text{re}(e_t) = e_t^Q$.

And, in matrix form, $$\tilde{S}_t = \left\{ \left[h_0^Q - \frac{\hat{b}}{\hat{a}} h_0^I\right] \cdots \left[h_L^Q - \frac{\hat{b}}{\hat{a}} h_L^I\right], \left[h_0^I - \frac{\hat{b}}{\hat{a}} h_0^Q\right] \cdots \left[h_L^I - \frac{\hat{b}}{\hat{a}} h_L^Q\right] \right\} \quad (20)$$

$$\begin{Bmatrix} u_t^I \\ \vdots \\ u_{t-L}^I \\ u_t^Q \\ \vdots \\ u_{t-L}^Q \end{Bmatrix} + \text{imag}\{e_t\} - \frac{\hat{b}}{\hat{a}} \text{re}\{e_t\} + R_{DC}$$

Equation 20 can now be written in the form of equation 15:

$$= \tilde{H}^T \tilde{U}_t + \text{imag}\{e_t\} - \frac{\hat{b}}{\hat{a}} \text{real}\{e_t\} + R_{DC} \quad (21)$$

However, since a and b (see equations 8 and 9) are not known, they have to be estimated within the channel estimator 424b using the second signal model $\tilde{S}_t$ and the resulting DC component, $R_{DC}$. One way of estimating $\hat{a}$ and $\hat{b}$ for each received burst is described in the exemplary optimizing b/a algorithm which follows:

1. Set i=o.
2.

$$\text{Let } \frac{\hat{b}}{\hat{a}} = \frac{b_i}{a_i}. \quad (22)$$

The start value $b_0/a_0$ can be based on some a priori information about these parameters, for instance some nominal nonlinear performance for the particular low noise amplifier 408 and mixers 414a and 414b. For instance, the b/a ratio can be between 1/10 to 10 then one can make a grid of N values (corresponding to i=0 . . . N−1) between 1/10 to 10 and compute Q ($b_i/a_i$) for all of these values (see Equation 24 and Steps 6–7 below).

$$\text{Find } \tilde{S}_t\left(\frac{\hat{b}}{\hat{a}}\right) = \tilde{Q}_t - \frac{\hat{b}}{\hat{a}} \tilde{I}_t \quad (23)$$

4. Synchronize to find the best synchronization position or known symbol pattern in the received burst. For example, this can be done by correlating between the received burst and the training sequence.
5. Channel estimate to find the estimated channel filter taps $\tilde{H}$ and $R_{DC}$ for the signal $$\tilde{S}_t\left(\frac{\hat{b}}{\hat{a}}\right).$$

For example, this can be done using conventional least-squares techniques as indicated by equation 24 below:

$$Q^{\min}\left[\frac{\hat{b}}{\hat{a}}\right] = \min_{\tilde{h}_k^I, \tilde{h}_k^Q, R_{DC}} \sum_{L=1}^{N} \left[\tilde{S}_t\left(\frac{\hat{b}}{\hat{a}}\right) - \sum_{k=1}^{L} \tilde{h}_k^I u_{t-k}^I - \sum_{k=1}^{L} \tilde{h}_k^Q u_{t-k}^Q - R_{DC}\right]^2 \quad (24)$$

$$\text{store } Q^{\min}\left[\frac{\hat{b}}{\hat{a}}\right] = f(i) \text{ and } \tilde{H}(i) = \tilde{H}_{opt}\left\{\frac{b_i}{a_i}\right\}$$

where $\tilde{H}_{opt}$ is the vector that yields f(i) in equation 24.

6. Set i=i+1
7. Perform steps 2–6 repetitively until all $$\frac{a_i}{b_i}$$

(e.g., i=0 . . . N−1) are used.

8. Find the lowest value, $f_{min}$, of all of the f(i) values. Select the corresponding $$\frac{a_i}{b_i}$$

value to be $$\frac{\hat{a}}{\hat{b}},$$

and select the corresponding $\tilde{H}(i)$ vector to be the estimated channel tap vector $\tilde{H}$.

Another way of estimating $\hat{a}$ and $\hat{b}$ for each received burst can be accomplished using various numerical search methods such as (for example):

$$\frac{b_i}{a_i} = \frac{b_{i-1}}{a_{i-1}} + f\left[Q\left(\frac{b_{(i-1)}}{a_{(i-1)}}\right)\right]$$

where the function $$f\left[Q\left(\frac{b_{(i-1)}}{a_{(i-1)}}\right)\right]$$

depends on the numerical search method utilized to find the optimal a and b values. For instance, the well known gradient method can be used where f is basically the derivative of Q (calculated as in Equation 24).

It should be understood that variations in the parameters a and b depends on quantities such as temperature and aging, implying a time constant which is much slower than a time constant of the radio channel. Therefore, the algorithm for finding optimal values of $\hat{a}$ and $\hat{b}$ need not be executed for every received burst, but just within some certain time intervals such as, for instance, every n:th received burst, or every k:th second.

How well the AM interfer is eliminated depends on how large $|p_t|^2$ is compared to the noise $e_t$ and also the relation between a and b. As such, for each particular received burst there is a determination as to whether the standard first signal model $S_t$ or the second signal model $\tilde{S}_t$ gives a higher (e.g., highest) signal-to-noise ratio. The processor 426 selects the first signal model $S_t$ or the second signal model $\tilde{S}_t$ based on the estimated channels filter taps $\tilde{H}$ and $\hat{H}$ and some quality parameters such as the residuals obtained in the channel estimators 424a and 430b.

Following is an exemplary way of how the processor 426 can decide whether to use the first signal model $S_t$ or the second signal model $\tilde{S}_t$. First, compare $f_{min}$ (see equation 24) to $g_{min}$ where:

$$g_{min} = \min_{\hat{h}_k} \sum_{L=1}^{N}\left(S_t - \sum_{k=1}^{L} \hat{h}_k u_{t-k}\right)^2. \quad (25)$$

If $f_{min} < \alpha g_{min}$ (where $\alpha$ is an application specific design parameter) then select the second signal model $\tilde{S}_t$ otherwise select the first signal model $S_t$. Thereafter, the estimated channel taps $\hat{H}$ or $\tilde{H}$ corresponding to the selected signal model $S_t$ or $\tilde{S}_t$ are input to the equalizer 428 that decodes the received signal.

A typical value of $\alpha$ is 1 which indicates that one selects the signal model $\tilde{S}_t$ or $S_t$ having the higher signal-to-noise ratio. However, empirical results indicate a better performance when an $\alpha$ smaller than 1 (e.g., 0.2–0.95) is utilized, in which case the second signal model $\tilde{S}_t$ must have a significantly better signal-to-noise ratio than the first signal model $S_t$ before it is chosen.

It should also be understood that the direct conversion receiver (any embodiment) is capable of operating using only the second signal model $\tilde{S}_t$, instead of having the processor 426 select which of the signal models $S_t$ or $\tilde{S}_t$ best fits the received signal.

Figure 5:
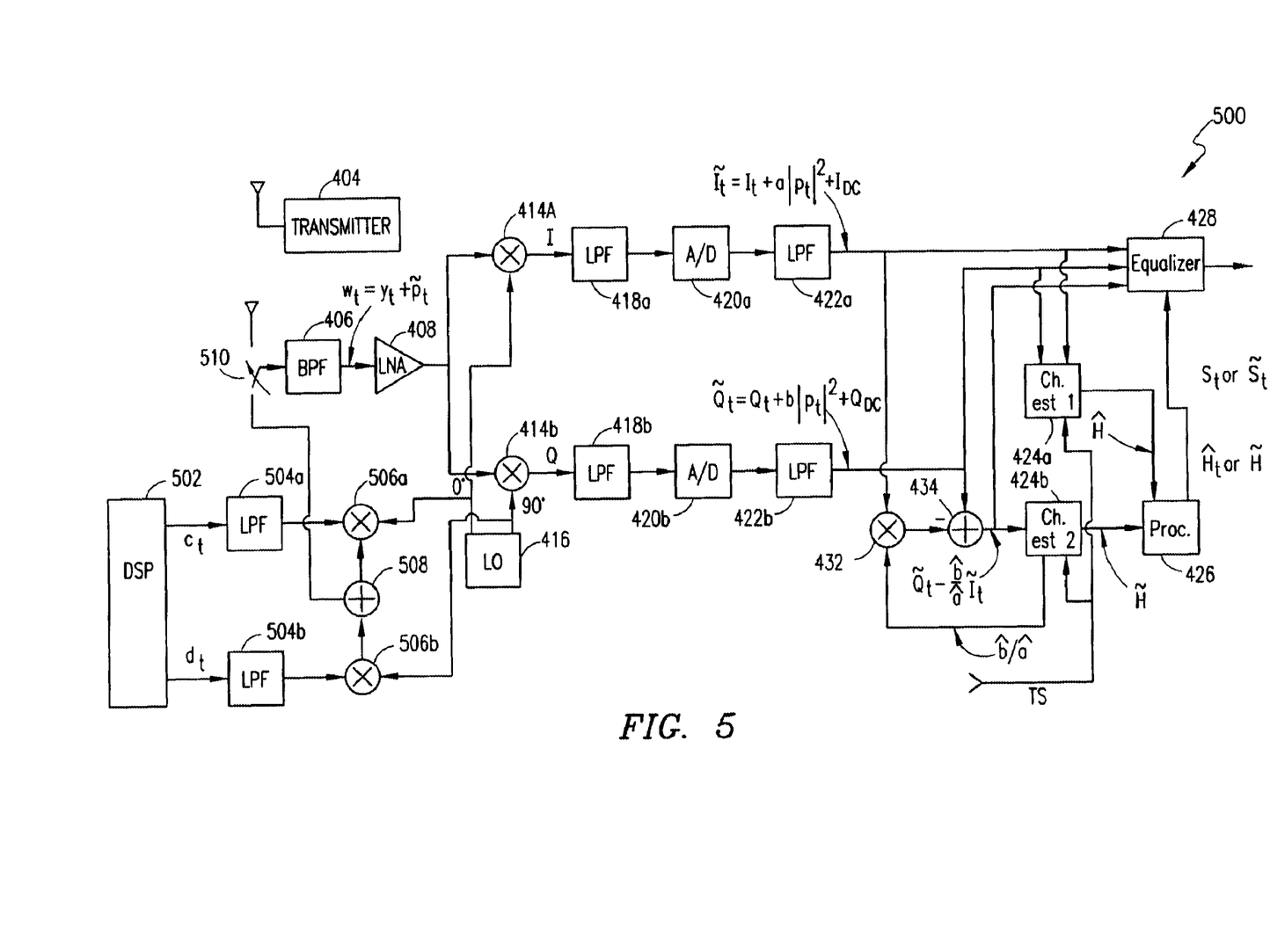
FIG. 5 is a block diagram illustrating in greater detail a second embodiment of the exemplary apparatus shown in FIG. 3.

Referring to FIG. 5, there is a block diagram illustrating in greater detail a second embodiment of an exemplary direct conversion receiver 500 in accordance with the present invention. The direct conversion receiver 500 is similar to the first embodiment except that instead of using the received signal to estimate parameters $\hat{a}$ and $\hat{b}$, the direct conversion receiver 500 uses internally generated test signals $c_t$ and $d_t$ to estimate parameters $\hat{a}$ and $\hat{b}$.

To avoid repetition, only the components used to internally generate the test signals $c_t$ and $d_t$ in the direct conversion receiver 500 are described, because the direct conversion receivers of the first and second embodiments otherwise have basically the same architecture and functionality.

The direct conversion receiver 500 includes a Digital Signal Processor (DSP) 502 or an Application-Specific Integrated Circuit (ASIC) operable to digitally generate the waveforms of the base band test signals $c_t$ and $d_t$. The test signals $c_t$ and $d_t$ include the received (desired) signal and the AM interfering signal, and can be represented as follows:

$$c_t = r_t \cos(\Phi_t) + p_t \cos(2\pi\Delta f t + \theta_t) \quad (26)$$

$$d_t = r_t \sin(\Phi_t) + p_t \sin(2\pi\Delta f t + \theta_t) \quad (27)$$

where $r_t \cos(\Phi_t)$ and $r_t \sin(\Phi_t)$ are the I and Q components of the desired signal, and $p_t \cos(\Delta\omega t + \theta_t)$ and $p_t \sin(\Delta\omega t + \theta_t)$ are the I and Q components of the AM interfering signal $\Delta f$ hertz from the desired signal.

The internally generated test signals $c_t$ and $d_t$ are respectively filtered in low pass filters (LPFS) 504a and 504b, and input to mixers 506a and 506b that convert the base band signals $c_t$ and $d_t$ up to the carrier frequency using the oscillating signals $LO_I$ and $LO_Q$ from the local oscillator 416. The mixers 506a and 506b output their respective internally generated test signals to an adder 508 which outputs an internally generated test signal to the band pass filter 406 through a switch 510.

Thereafter, the direct conversion receiver 500 operates to estimate the parameters $\hat{a}$ and $\hat{b}$ in the same manner as described above with respect to the first embodiment, except that the internally generated test signals $c_t$ and $d_t$ are used instead of the signal received at the antenna 402. After estimating the parameters $\hat{a}$ and $\hat{b}$, the switch 510 is positioned to connect the antenna 402 and the band pass filter 406 to enable the further operation of the direct conversion receiver 500 (see discussion with respect to FIG. 4).

An advantage of using the internally generated test signals $c_t$ and $d_t$ in this self test option is that one can design and control the interfering signal in such a way that the identification process of the parameters a and b can be easily optimized.

Figure 6:
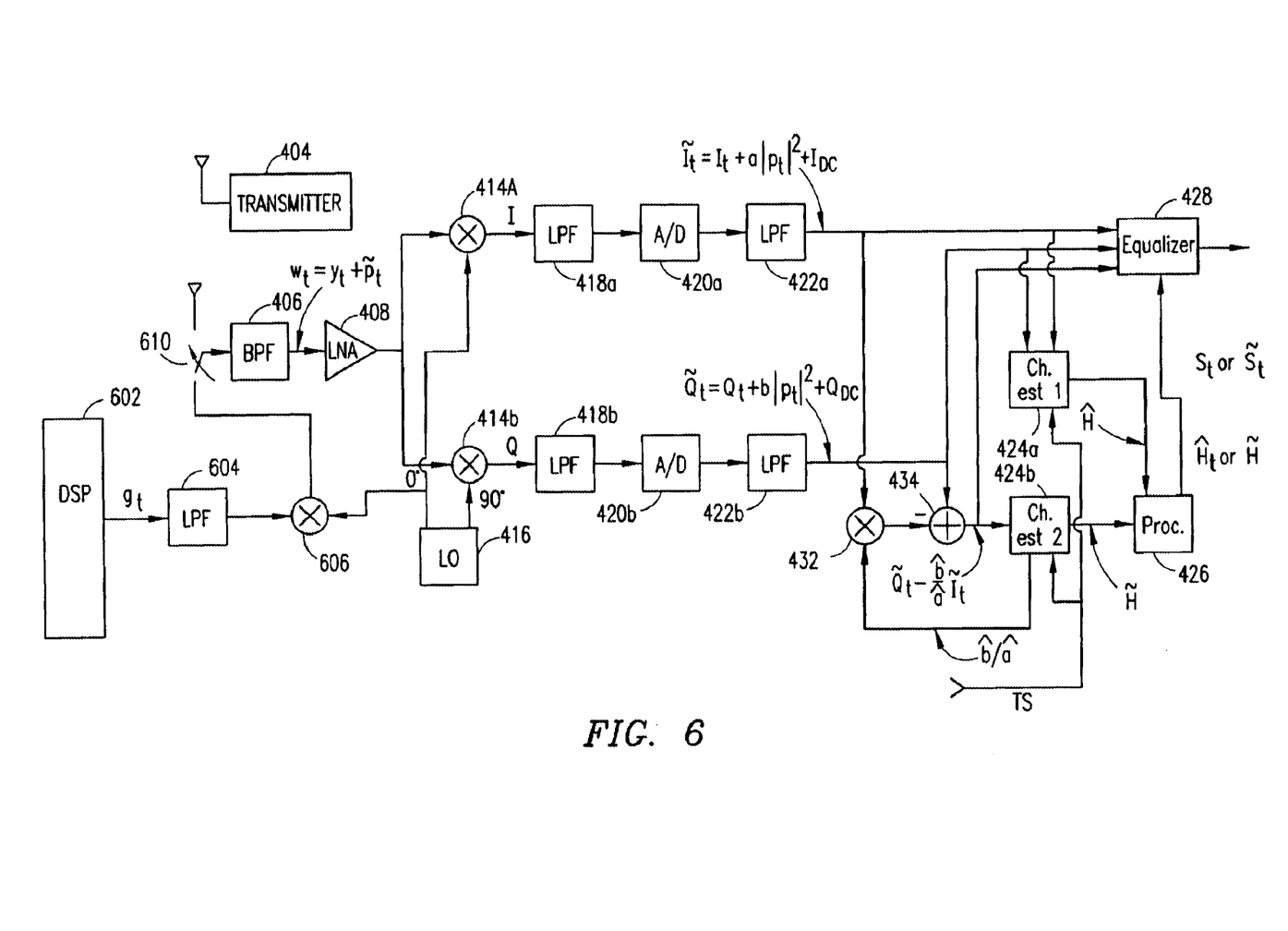
FIG. 6 is a block diagram illustrating in greater detail a third embodiment of the exemplary apparatus shown in FIG. 3.

Referring to FIG. 6, there is a block diagram illustrating in greater detail a third embodiment of an exemplary direct conversion receiver 600 in accordance with the present invention. The direct conversion receiver 600 is similar to the first embodiment except that instead of using the received signal to estimate parameters $\hat{a}$ and $\hat{b}$, the direct conversion receiver 600 uses a single internally generated test signal $g_t$ to estimate parameters $\hat{a}$ and $\hat{b}$.

To avoid repetition, only the components used to internally generate the test signal $g_t$ in the direct conversion receiver 600 are described, because the direct conversion receivers of the first and third embodiments otherwise have basically the same architecture and functionality.

The direct conversion receiver 600 includes a Digital Signal Processor (DSP) 602 or an Application-Specific Integrated Circuit (ASIC) operable to digitally generate the waveform of the base band test signal $g_t$. The test signal $g_t$ includes the received (desired) signal and the AM interfering signal, and can be represented as follows:

$$g_t = r_t \cos(\Phi_t) + p_t \cos(2\pi \Delta f t + \theta_t) \quad (28)$$

where $r_t \cos(\Phi_t)$ is the I component of the desired signal, and $p_t \cos(\Delta \omega t + \theta_t)$ is the I component of the AM interfering signal $\Delta f$ hertz from the desired signal.

Thereafter, the internally generated test signal $g_t$ is filtered by a low pass filter (LPF) 604, and input to a mixer 606 that converts the base band signal $g_t$ up to the carrier frequency using the oscillating signal $LO_I$ from the local oscillator 416. The mixer 606 creates two interfering signals an equal distance ($\pm \Delta f$) from the desired carrier such that the use of the desired signal $r_t \cos(\Phi_t)$ may not be needed. Therefore, the internally generated test $g_t$ can be represented as follows:

$$g_t = p_t \cos(2\pi \Delta f t + \theta_t) \quad (29)$$

The mixer 606 outputs the internally generated test signal to the band pass filter 406 through a switch 610. Thereafter, the direct conversion receiver 600 operates to estimate the parameters $\hat{a}$ and $\hat{b}$ in the same manner as described above with respect to the first embodiment, except that the internally generated test signal $g_t$ is used instead of the signal received at the antenna 402. After estimating the parameters $\hat{a}$ and $\hat{b}$, the switch 610 is positioned to connect the antenna 402 and the band pass filter 406 to enable the further operation of the direct conversion receiver 500 (see discussion with respect to FIG. 4).

An advantage of using the internally generated test signal $g_t$ in this self test option is that one can design and control the interfering signal in such a way that the identification process of the parameters a and b can be easily optimized.

Figure 7:
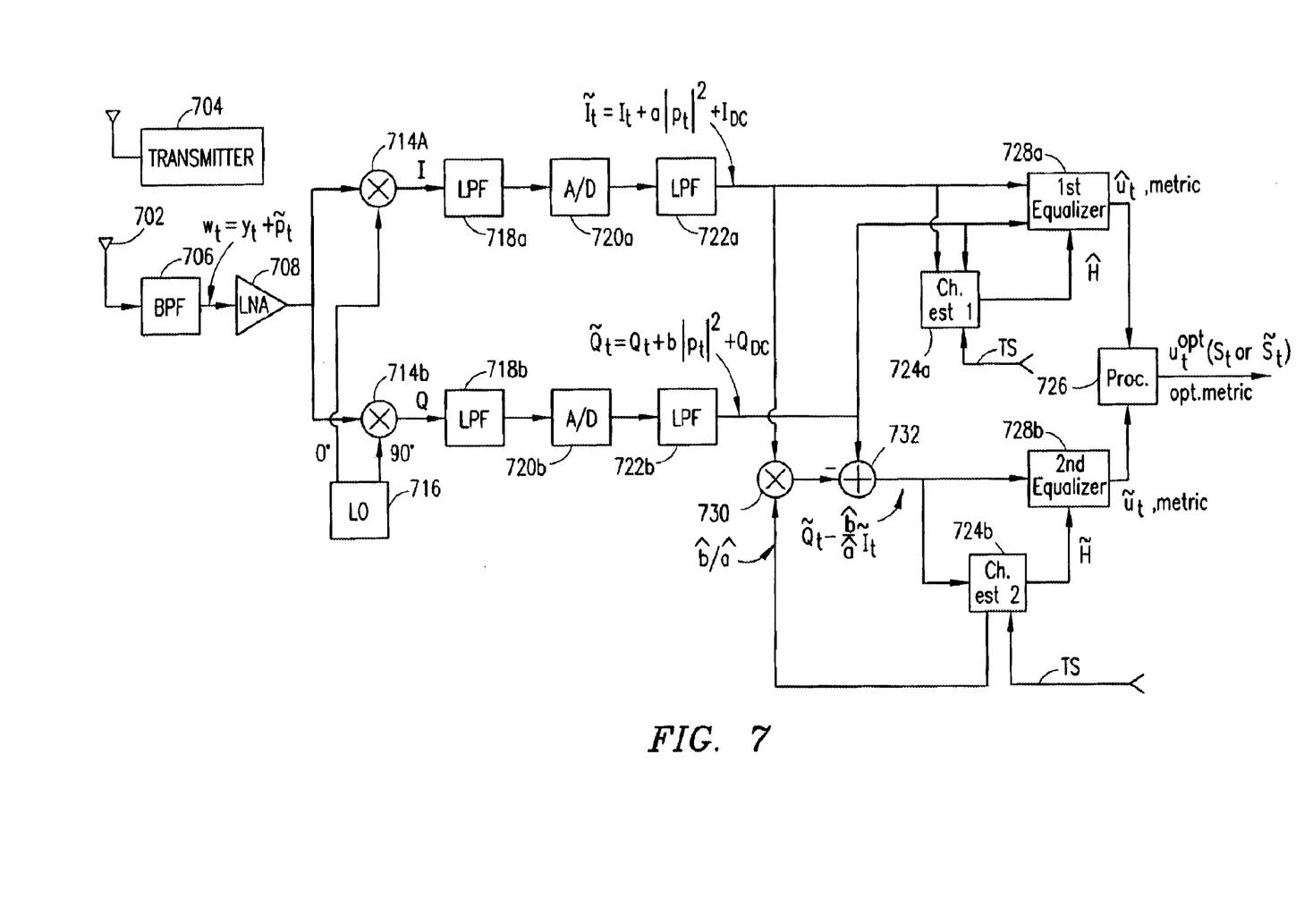
FIG. 7 is a block diagram illustrating in greater detail a fourth embodiment of the exemplary apparatus shown in FIG. 3.

Referring to FIG. 7, there is a block diagram illustrating in greater detail a fourth embodiment of an exemplary direct conversion receiver 700 in accordance with the present invention. The direct conversion receiver 700 is similar to the first embodiment except that instead of selecting the first or second signal model $S_t$ or $\tilde{S}_t$ before the equalizer 428 (see FIG. 4) the selection of the signal model $S_t$ or $\tilde{S}_t$ is made after first and second equalizers 728a and 728b.

The direct conversion receiver 700 includes an antenna 702 for receiving a signal from a transmitter 704. The received signal is filtered by a band pass filter (BPF) 706 designed to pass a desired frequency band such as the GSM (Global System for Mobile Communications) frequency band from the received signal. The received signal output from the band pass filter 706 can be represented as:

$$\begin{aligned} w_t &= y_t + \tilde{p}_t & (30) \\ &= r_t \cos(\omega_0 t + \varphi_t) + p_t \cos(\omega_1 t + \theta_t) & (31) \end{aligned}$$

where $w_t$ is the received signal, $y_t$ is the desired signal at carrier frequency $\omega_0$, $\tilde{p}_t$ is the near-channel AM interfering signal at carrier frequency $\omega_1$, and $\omega_0$ and $\omega_1$ are within the pass band of the band pass filter 706.

The filtered signal is amplified in a low noise amplifier (LNA) 708 and down-converted to a base band Inphase (I) component and a base band Quadrature (Q) component using mixers 714a and 714b, respectively, and a local oscillator (LO) 716. The local oscillator 716 outputs two oscillation signals $LO_I$ and $LO_Q$ adapted to a carrier frequency of the received signal, the two oscillation signals can be represented as follows:

$$LO_I(t) = \cos(\omega_0 t) \quad (32)$$

$$LO_Q(t) = \sin(\omega_0 t) \quad (33)$$

where $LO_I$ and $LO_Q$ are the oscillating signals associated with the I and Q components, respectively. The oscillating signals $LO_I$ and $LO_Q$ and the received signal are multiplied in the mixers 714a and 714b.

Due to the nonlinearities of the local oscillator 716 and interferer leakage (represented with the scale factors $\alpha'$, $\beta'$), the low pass filtered signal output from the I component mixer 714a and a first low pass filter 718a can be represented as follows:

$$\begin{aligned} \tilde{I}_t &= LPF\{(r_t \cos(\omega_0 t + \varphi_t) + p_t \cos(\omega_1 t + \theta_t) + \\ &\quad \alpha'_I \cos(\omega_0 t + \gamma)) * (\cos(\omega_0 t) + \beta'_I p_t \cos(\omega_1 t + \theta_t + \delta))\} \end{aligned} \quad (34)$$

$$= r_t \cos \varphi_t + \beta_I p_t^2 + \alpha_I \quad (35)$$

Likewise, the low pass filtered signal output from the Q component mixer 714b and a first low pass filter (LPF) 718b can be represented as follows:

$$\tilde{Q}_t = r_t \sin \phi_t + \beta_Q p_t^2 + \alpha_Q \quad (36)$$

Thereafter, the I and Q components are respectively converted into digital domain by analog-to-digital convertors (A/Ds) 720a and 720b and respectively filtered by second low pass filters (LPFs) 722a and 722b. And, after certain normalizations the base band components can be represented as:

$$\tilde{I}_t = I_t + a|p_t|^2 + I_{DC} \quad (37)$$

$$\tilde{Q}_t = Q_t + b|p_t|^2 + Q_{DC} \quad (38)$$

where $I_t$, $Q_t$ are the wanted I and Q components, and $I_{DC}$, $Q_{DC}$ are the DC components on the I and Q components, respectively. $|p_t|^2$ is the low pass filtered and sampled squared envelope of the interfering AM signal. In case of digital transmission over radio channels with intersymbol interference, such as for instance in GSM or a D-AMPS cellular systems, the wanted I and Q components can be written in a complex notation as follows:

$$I_t + jQ_t = H^T U_t + e_t \quad (39)$$

where $H = [h_0, \ldots, h_L]^T$ is a vector of complex valued channel filter taps, $U_t = [u_t, \ldots, u_{t-L}]^T$ is a vector of complex transmitted symbols, and $e_t$ is some kind of complex valued noise. Therefore, the complex valued base band signal or a first signal model $S_t$ can be represented as:

$$S_t = \tilde{I}_t + j\tilde{Q}_t \quad (40)$$

$$= H^T U_t + (a + jb)|p_t|^2 + DC + e_t \quad (41)$$

$$= \sum_{k=o}^{L} \{h_k^I + jh_u^Q\}\{U_t^I + jU_t^Q\} + e_t^I + je_t^Q \quad (42)$$

where $j = \sqrt{-1}$.

The $\tilde{I}_t$ and $\tilde{Q}_t$ components are input to a first channel estimator 724a that correlates, using the first signal model $S_t$, a known training sequence (TS) with the received signal $S_t$ containing the same known training sequence to determine a synchronization position and an estimate of the first set of channel filter taps $\hat{H}$. The use of the first signal model $S_t$ in estimating the channel filter taps $\hat{H}$ is well known in the art. The estimated channel filter taps $\hat{H}$ are then input to a first equalizer 728a that decodes the signal and outputs the decided signal $\hat{u}_t$ and metrics to a processor 726.

Generally, the present invention includes a second channel estimator 724b that utilizes a second signal model $\tilde{S}_t$ to estimate a second set of channel filter taps $\tilde{H}$. The second set of channel filter taps $\tilde{H}$ are input to the second equalizer 728b that decodes the signal and outputs the decided signal $\tilde{u}_t$ and metrics to the processor 726. To obtain the second signal model $\tilde{S}_t$ represented as the component $$\tilde{Q}_t - \frac{\hat{b}}{\hat{a}} \tilde{I}_t,$$

the second low pass filter 722a outputs the $\tilde{I}_t$ component to a multiplicator 730 that also receives estimated parameters $\hat{b}/\hat{a}$ from channel estimator 724b. The estimated parameters $\hat{a}$ and $\hat{b}$ are determined in the channel estimator 724b in a similar manner as described-above with respect to the channel estimator 424b of the first embodiment (see FIG. 4 and related description). The multiplicator 730 outputs $$-\frac{\hat{b}}{\hat{a}} \tilde{I}_t$$

to a subtractor 732 that also receives $\tilde{Q}_t$ and, in turn, outputs $$\tilde{Q}_t - \frac{\hat{b}}{\hat{a}} \tilde{I}_t$$

to the second equalizer 728b and the second channel estimator 724b.

More specifically, the second channel estimator 724b correlates, using the second signal model $\tilde{S}_t$, the known training sequence (TS) with the $$\tilde{Q}_t - \frac{\hat{b}}{\hat{a}} \tilde{I}_t$$

component to determine a synchronization position and an estimate of the second set of channel filter taps $\tilde{H}$. The estimated channel filter taps $\tilde{H}$ are input to the second equalizer 728b that decodes the signal and outputs the decided signal $\tilde{u}_t$ and metrics to the processor 726. Thereafter, the processor 726 selects either the first or second signal models $S_t$ or $\tilde{S}_t$ based on the metrics and decided signals $\hat{u}_t$ and $\tilde{u}_t$.

The selection between the signal models $\tilde{S}_t$ and $S_t$ in this embodiment is based on metrics, more particularly in the equalizers 728a and 728b the respective channel filter taps $\hat{H}$ and $\tilde{H}$ are each used to decode the symbols $\hat{u}$ and $\tilde{u}$. The metrics for the second signal model $\tilde{S}_t$ is similar to equation 24, and the metrics for the first signal model $S_t$ is similar to equation 25, but instead of minimizing with respect to the radio channels $\tilde{H}$ and $\hat{H}$ one minimizes with respect to the symbols $\hat{u}$ and $\tilde{u}$. Thus, the same kind of decision process can be used as in the channel estimation case. For example, if metric (of $\tilde{S}_t$)<α(metric) (of $S_t$) then use the estimated symbols from the second signal model $\tilde{S}_t$ to further process the received signal; otherwise use the estimated symbols from the first signal model $S_t$ to further process the received signal.

It should be understood that the direct conversion receiver 700 can also be adapted to use the internally generated test signals $c_t$ and $d_t$ (see FIG. 5) or the internally generated test signal $g_t$ (see FIG. 6) to estimate the parameters $\hat{a}$ and $\hat{b}$.

Figure 8:
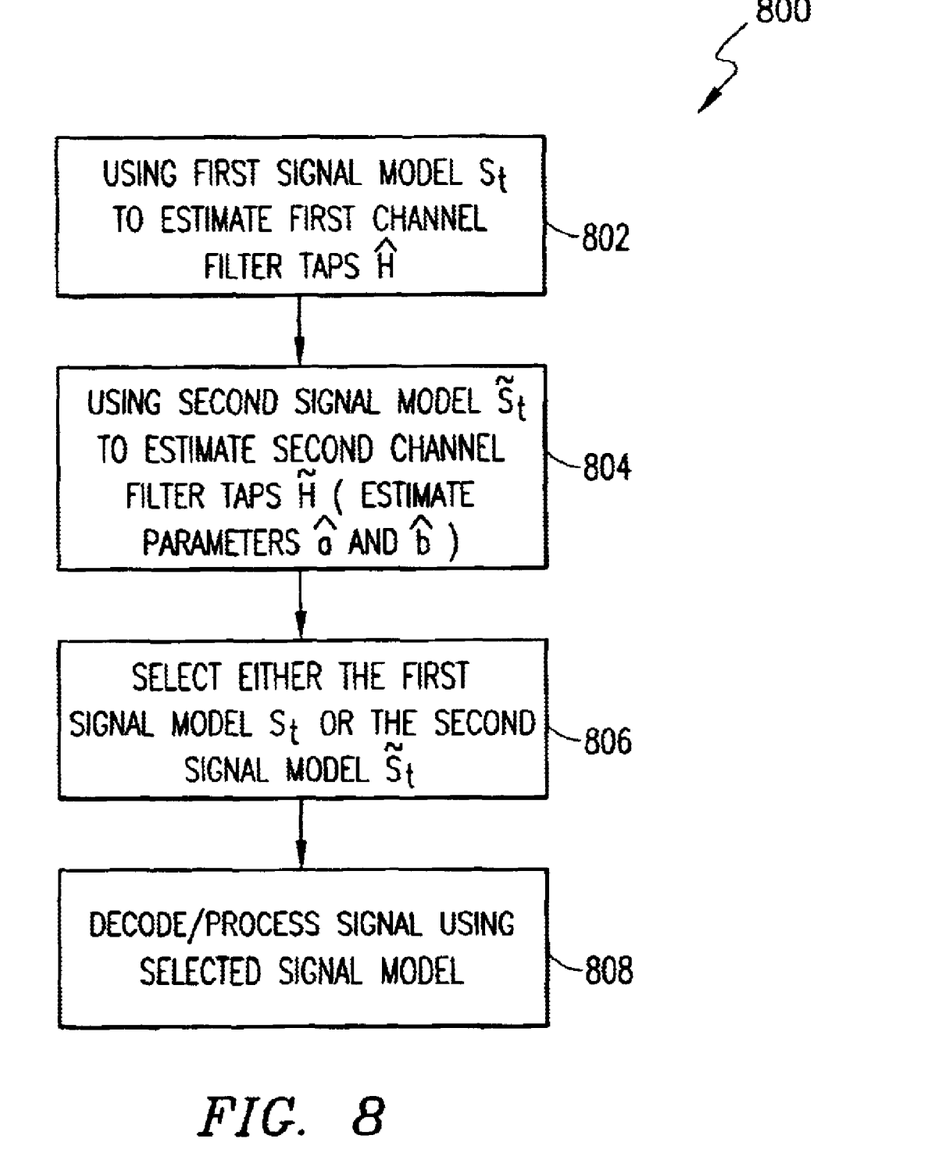
FIG. 8 is a flowchart illustrating the basic steps of the preferred method in accordance with the present invention.

Referring to FIG. 8, there is a flowchart illustrating the basic steps of an exemplary method 800 in accordance with the present invention. Beginning at step 802, the first signal model $S_t$ is used to estimate the set of first channel filter taps $\hat{H}$.

At step 804, the second signal model $\tilde{S}_t$ is used to estimate the set of second channel filter taps $\tilde{H}$, including estimating the a and b parameters using an optimizing algorithm such as described above with respect to the first embodiment. The received signal, the internally generated signals $c_t$ and $d_t$ (see FIG. 5) or the internally generated signal $g_t$ (see FIG. 6) can be used to estimate the parameters $\hat{a}$ and $\hat{b}$.

At step 806, a selection of the first signal model $S_t$ or the second signal model $\tilde{S}_t$ is made depending on which model better enables the elimination of the near-channel interfering signal from the received signal (see description associated with the first embodiment). The selection of the first signal model $S_t$ or the second signal model $\tilde{S}_t$ can take place before the equalization of the received signal (see FIG. 4) or after parallel equalizations of the received signal (see FIG. 7).

In the event the selection of the signal models $S_t$ or $\tilde{S}_t$ takes place before the equalization of the received signal, the selection is made using the estimated plurality of first channel filter taps $\hat{H}$, the estimated plurality of second channel filter taps $\tilde{H}$ and at least one quality parameter. Otherwise, in the event the selection of the signal models $S$ or $\tilde{S}_t$ takes place after parallel equalizations of the received signal, the selection is made using metrics and the decided signals $\hat{u}_t$ and $\tilde{u}_t$.

At step 808, the received signal is decoded and further processed using the selected signal model $S_t$ or $\tilde{S}_t$.

From the foregoing, it can be readily appreciated by those skilled in the art that the present invention provides an apparatus and method that compensates for the problematic time-varying DC offset by effectively eliminating the AM interferer from the received signal. Also, the apparatus and method disclosed can suppress the AM interferer in a cost and current efficient manner as compared to the prior art. It will also be apparent to workers in the art that the invention can be readily implemented, for example, by suitable modifications in software, hardware or both, in conventional radio receivers such as direct conversion receivers.

Although several embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An apparatus capable of compensating for a time-varying DC offset by substantially removing an amplitude modulated interfering signal from a received signal, said apparatus comprising:
    a first channel estimator for estimating a plurality of first channel filter taps using the received signal and a first signal model;
    a second channel estimator for estimating a plurality of second channel filter taps using the received signal and a second signal model; and
    a processor for selecting which of the first signal model and the second signal model operates better to substantially remove the amplitude modulated interfering signal from the received signal.

2. The apparatus of claim 1, wherein said first signal model is represented as:

$$S_t = \tilde{I}_t + j\tilde{Q}_t$$

where $\tilde{I}_t$ is a baseband inphase (I) signal and $\tilde{Q}_t$ is a baseband quadrature (Q) signal of the received signal.

3. The apparatus of claim 1, wherein said second signal model is represented as:

$$\tilde{S}_t\left(\frac{\hat{b}}{\hat{a}}\right) = \tilde{Q}_t - \frac{\hat{b}}{\hat{a}}\tilde{I}_t$$

where $\hat{a}$ and $\hat{b}$ are estimated parameters of the amplitude modulated interfering signal, and $\tilde{I}_t$ is a baseband inphase (I) signal and $\tilde{Q}_t$ is a baseband quadrature (Q) signal of the received signal.

4. The apparatus of claim 3, wherein said estimated parameters $\hat{a}$ and $\hat{b}$ are determined in accordance with an optimizing algorithm.

5. The apparatus of claim 4, wherein said optimizing algorithm is executed during each received burst, during a predetermined number of received bursts or during a predetermined number of seconds.

6. The apparatus of claim 3, wherein said estimated parameters $\hat{a}$ and $\hat{b}$ are estimated using the received signal.

7. The apparatus of claim 3, wherein said estimated parameters $\hat{a}$ and $\hat{b}$ are estimated using at least one internally generated test signal.

8. The apparatus of claim 1, wherein said processor operates to select the first signal model or the second signal model depending on which of the signal models has a higher signal-to-noise ratio.

9. The apparatus of claim 1, wherein said processor operates to select the first signal model or the second signal model using the estimated plurality of first channel filter taps, the estimated plurality of second channel filter taps and at least one quality parameter.

10. The apparatus of claim 1, further comprising an equalizer for processing the received signal using the selected signal model.

11. The apparatus of claim 1, further comprising a first equalizer for receiving the estimated plurality of first channel filter taps and a second equalizer for receiving the estimated plurality of second channel filter taps, wherein said processor operates to receive information from said first equalizer and said second equalizer prior to selecting the first signal model or the second signal model.

12. The apparatus of claim 1, wherein said apparatus is a mobile phone, a base station or a direct conversion receiver.

13. A communications system capable of substantially eliminating a near-channel interferer from a received signal, said communications system comprising:
- a first channel estimator for estimating a plurality of first channel filter taps using the received signal and a first signal model;
- a second channel estimator for estimating a plurality of second channel filter taps using the received signal and a second signal model; and
- a processor for selecting which of the first signal model and the second signal model operates better to substantially eliminate the near-channel interferer from the received signal.

14. The communications system of claim 13, wherein said first signal model is represented as:

$$S_t = \tilde{I}_t + j\tilde{Q}_t$$

where $\tilde{I}_t$ is a baseband inphase (I) signal and $\tilde{Q}_t$ is a baseband quadrature (Q) signal of the received signal.

15. The communications system of claim 13, wherein said second signal model is represented as:

$$\tilde{S}_t\left(\frac{\hat{b}}{\hat{a}}\right) = \tilde{Q}_t - \frac{\hat{b}}{\hat{a}}\tilde{I}_t$$

where $\hat{a}$ and $\hat{b}$ are estimated parameters of the near-channel interferer, and $\tilde{I}_t$ is a baseband inphase (I) signal and $\tilde{Q}_t$ is a baseband quadrature (Q) signal of the received signal.

16. The communications system of claim 15, wherein said estimated parameters $\hat{a}$ and $\hat{b}$ are determined in accordance with an optimizing algorithm.

17. The communications system of claim 16, wherein said optimizing algorithm is executed during each received burst, during a predetermined number of received bursts or during a predetermined number of seconds.

18. The communications system of claim 15, wherein said estimated parameters $\hat{a}$ and $\hat{b}$ are estimated using the received signal.

19. The communications system of claim 15, wherein said estimated parameters $\hat{a}$ and $\hat{b}$ are estimated using at least one internally generated test signal.

20. The communications system of claim 13, wherein said processor operates to select the first signal model or the second signal model depending on which of the signal models has a higher signal-to-noise ratio.

21. The communications system of claim 13, wherein said processor operates to select the first signal model or the second signal model using the estimated plurality of first channel filter taps, the estimated plurality of second channel filter taps and at least one quality parameter.

22. The communications system of claim 13, further comprising an equalizer for processing the received signal using the selected signal model.

23. The communications system of claim 13, further comprising a first equalizer for receiving the estimated plurality of first channel filter taps and a second equalizer for receiving the estimated plurality of second channel filter taps, wherein said processor operates to receive information from said first equalizer and said second equalizer prior to selecting the first signal model or the second signal model.

24. A method of reducing an effect of a near-channel interfering signal on a received signal, comprising the steps of:
- utilizing a first signal model and the received signal to estimate a plurality of first channel filter taps;
- utilizing a second signal model and the received signal to estimate a plurality of second channel filter taps; and
- selecting which of the first signal model and the second signal model operates better to substantially remove a near-channel interfering signal from the received signal.

25. The method of claim 24, wherein said first signal model is represented as:

$$S_t = \tilde{I}_t + j\tilde{Q}_t$$

where $\tilde{I}_t$ is a baseband inphase (I) signal and $\tilde{Q}_t$ is a baseband quadrature (Q) signal of the received signal.

26. The method of claim 24, wherein said second signal model is represented as:

$$\tilde{S}_t\left(\frac{\hat{b}}{\hat{a}}\right) = \tilde{Q}_t - \frac{\hat{b}}{\hat{a}}\tilde{I}_t$$

where â and b̂ are estimated parameters of the near-channel interfering signal, and $\tilde{I}_t$ is a baseband inphase (I) signal and $\tilde{Q}_t$ is a baseband quadrature (Q) signal of the received signal.

27. The method of claim 26, wherein said step of utilizing a second signal model further includes estimating said parameters using an optimizing algorithm.

28. The method of claim 27, wherein said step of estimating said â and b̂ parameters occurs during each received burst, during a predetermined number of received bursts or during a predetermined number of seconds.

29. The method of claim 26, wherein said estimated parameters â and b̂ are estimated using the received signal or at least one internally generated test signal.

30. The method of claim 24, wherein said step of selecting the first signal model or the second signal model is determined using the estimated plurality of first channel filter taps, the estimated plurality of second channel filter taps and at least one quality parameter.

31. The method of claim 24, further comprising the step of decoding the received signal using the selected signal model.

32. The method of claim 24, further comprising the steps of decoding the received signal using the first signal model and decoding the received signal using the second signal model prior to selecting the first signal model or the second signal model.

33. An apparatus capable of substantially removing an amplitude modulated interfering signal from a received signal, said apparatus comprising:

a channel estimator for estimating a plurality of first channel filter taps using a signal model represented as:

$$\tilde{S}_t\left(\frac{\hat{b}}{\hat{a}}\right) = \tilde{Q}_t - \frac{\hat{b}}{\hat{a}}\tilde{I}_t$$

where â and b̂ are estimated parameters of the amplitude modulated interfering signal, and $\tilde{I}_t$ is a baseband inphase (I) signal and $\tilde{Q}_t$ is a baseband quadrature (Q) signal of the received signal; and an equalizer, coupled to said channel estimator, for processing the received signal using the estimated channel filter taps.

34. A method for substantially removing an amplitude modulated interfering signal from a received signal, said method comprising the steps of:

estimating a plurality of first channel filter taps using a signal model represented as:

$$\tilde{S}_t\left(\frac{\hat{b}}{\hat{a}}\right) = \tilde{Q}_t - \frac{\hat{b}}{\hat{a}}\tilde{I}_t$$

where â and b̂ are estimated parameters of the amplitude modulated interfering signal, and $\tilde{I}_t$ is a baseband inphase (I) signal and $\tilde{Q}_t$ is a baseband quadrature (Q) signal of the received signal; and processing the received signal using the estimated channel filter taps.

* * * * *